US006894381B2

(12) United States Patent
Hetzel et al.

(10) Patent No.: US 6,894,381 B2
(45) Date of Patent: May 17, 2005

(54) ELECTRONIC DEVICE HAVING A STACK OF SEMICONDUCTOR CHIPS AND METHOD FOR THE PRODUCTION THEREOF

(75) Inventors: Wolfgang Hetzel, Nattheim (DE); Anton Legen, Munich (DE); Jochen Thomas, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/738,071

(22) Filed: Dec. 17, 2003

(65) Prior Publication Data

US 2004/0159954 A1 Aug. 19, 2004

(30) Foreign Application Priority Data

Dec. 17, 2002 (DE) .......................................... 102 59 221

(51) Int. Cl.[7] .............................................. H01L 23/02
(52) U.S. Cl. ....................... 257/686; 257/685; 257/777; 438/109; 438/107; 438/110
(58) Field of Search ................................. 257/685, 686, 257/777, E23.007, E23.011, E23.012

(56) References Cited

U.S. PATENT DOCUMENTS

| 5,539,250 | A | 7/1996 | Kitano et al. | |
| 5,804,874 | A | 9/1998 | An et al. | |
| 5,861,666 | A | 1/1999 | Bellaar | |
| 6,163,070 | A | 12/2000 | Mori | |
| 6,303,997 | B1 | * 10/2001 | Lee | 257/778 |
| 6,472,736 | B1 | * 10/2002 | Yeh et al. | 257/686 |
| 6,545,366 | B2 | * 4/2003 | Michii et al. | 257/777 |
| 6,683,385 | B2 | * 1/2004 | Tsai et al. | 257/777 |
| 6,686,656 | B1 | * 2/2004 | Koh et al. | 257/686 |
| 2001/0005042 | A1 | 6/2001 | Burns | |

FOREIGN PATENT DOCUMENTS

| DE | 100 23 823 A1 | 12/2001 |
| JP | 2002057272 | 2/2002 |
| KR | 2000-0042112 | 7/2000 |
| KR | 2001-028845 | 4/2001 |

* cited by examiner

Primary Examiner—Jasmine Clark
(74) Attorney, Agent, or Firm—Dicke, Billig & Czaja, PLLC

(57) ABSTRACT

The invention relates to an electronic device having a stack of semiconductor chips, and to a method for the production thereof. A first semiconductor chip is arranged on a rewiring substrate, and at least one semiconductor stack chip is arranged on the first semiconductor chip. A rewiring plane is arranged between the semiconductor chips. The contact areas of the semiconductor chips are connected to external contacts of the device by the rewiring plane and the rewiring substrate.

18 Claims, 3 Drawing Sheets

ELECTRONIC DEVICE HAVING A STACK OF SEMICONDUCTOR CHIPS AND METHOD FOR THE PRODUCTION THEREOF

CROSS-REFERENCE TO RELATED APPLICATIONS

This Utility Patent Application claims priority to German Patent Application No. DE 102 59 221.7, filed on Dec. 17, 2002, which is incorporated herein by reference.

BACKGROUND

The invention relates to an electronic device having a stack of semiconductor chips, in particular a stack of semiconductor memory chips, and to a method for the production thereof.

Specification U.S. Pat. No. 2001/000 5042 A1 discloses an electronic device having a stack of semiconductor chips. Each semiconductor stack chip has external contacts distributed over its active upper side. The external contacts of each semiconductor stack chip are connected by a structure of flat conductors, which is matched to the surface distribution of the external contacts, to external sections of the flat conductors. The external sections of each semiconductor stack chip are mechanically and electrically connected to the respectively underlying external sections of the flat conductors of the underlying semiconductor stack chip. Such a stack structure is complex and intricate to construct, so that the function of the electronic device with semiconductor chips cannot be reliably guaranteed.

SUMMARY

One embodiment of the present invention provides an electronic device having a stack of semiconductor chips, and in particular semiconductor memory chips, the function of which is guaranteed with high probability and which can be produced inexpensively.

One embodiment of the invention is an electronic device having a stack of semiconductor chips, wherein the semiconductor chips in the stack have active upper sides with contact areas. Stacked semiconductor chips are arranged on a first semiconductor chip, which is arranged as the lowermost semiconductor chip. Rewiring planes are arranged between the semiconductor chips. These rewiring planes have first contact regions in the vicinity of the bonding hole and second contact regions, which are connected to the first contact regions of the rewiring plane. The electronic device furthermore has a rewiring substrate with external contacts, which are on the lower side of the rewiring substrate. There are contact-terminal areas on the upper side of the rewiring substrate. A continuous bonding hole, which has bonding fingers in its edge region on the lower side of the rewiring substrate, passes through the rewiring substrate.

In one embodiment, the semiconductor chips and the rewiring planes on the rewiring substrate are covered by a plastic composition in a package. The contact areas of the first semiconductor chips are connected by bonding connections, through the bonding hole of the rewiring substrate, to bonding fingers on the lower side of the rewiring substrate, the bonding fingers on the lower side of the rewiring substrate being connected by vias to the contact-terminal areas on the upper side of the rewiring substrate. The contact areas of the semiconductor stack chip are connected to first contact regions in the vicinity of the bonding hole of the rewiring plane. The second contact regions of the rewiring plane are connected to the contact-terminal areas of the rewiring substrate by stack connections.

In such an electronic device, the active upper sides of the semiconductor chips are aligned in the same way, which allows inexpensive interconnection of the semiconductor chips with the contact-terminal areas of the rewiring substrate which has the external contacts, without a crossover connection technique and without a mirror-image arrangement of the contact areas of the semiconductor stack chips which are to be connected to one another. Also, each individual assembly comprising a stack chip and a rewiring plane, and each assembly comprising the first semiconductor chip and the rewiring substrate can have its function tested individually. During such function tests, the individual semiconductor stack chips with their rewiring planes, or the first semiconductor chip with its rewiring substrate, are exposed cyclically to extreme temperatures, and hence each defective assembly can be discarded before the electronic device is put together. The rejection of completed electronic devices is hence reduced, since each of the semiconductor chips of the electronic device has already been tested in its interaction with the rewiring plane, or the rewiring substrate.

Whereas the rewiring substrate has to carry the entire stack, including the plastic composition of the package, the rewiring plane is merely used to provide a means of connection between contact areas of the semiconductor stack chips and contact-terminal areas of the rewiring substrate. The rewiring substrate, which provides support, is consequently designed to be substantially thicker than the rewiring plane between the semiconductor chips. At the same time, the difference in thickness between the rewiring substrate and the rewiring plane is used to compensate for the propagation-time differences between a semiconductor stack chip and the first semiconductor chip, or to match the propagation times of a semiconductor stack chip and the first semiconductor chip to one another.

Owing to the small thickness of the rewiring plane, it is possible to double the circuit density of an electronic device by stacking two semiconductor chips, without increasing the standardized dimensions of the package. Besides a minimal working thickness of the rewiring plane, it is also possible to employ thinned semiconductor chips in order to use standardized package dimensions even though the storage capacity is multiplied.

The rewiring substrate which carries the stack of semiconductor chips may have a solder resist layer on its lower side, which covers a lower rewiring layer while leaving external-contact areas of the rewiring layer exposed. This rewiring layer is carried by an insulating core layer, which additionally has an upper rewiring layer. The upper rewiring layer of the rewiring substrate and the lower rewiring layer are connected to one another by vias through the core layer. Whereas the external-contact areas of the lower rewiring layer carry the external contacts of the electronic device, on the upper rewiring layer the contact-terminal areas are arranged on the edge regions of the rewiring substrate.

A rewiring substrate structured in this way has, on the upper side of the core layer, rewiring lines that connect the vias to the contact-terminal areas, and on the lower side, a rewiring layer that connects, by rewiring lines, on the one hand the bonding fingers in the vicinity of the bonding hole to the external-contact areas and therefore to the external contacts and, on the other hand, the external-contact areas to the vias. The external-contact areas on the lower side of the rewiring substrate, and therefore the external contacts of the electronic device, are hence electrically connected to the contact areas of the first semiconductor chip and, at the same time, to the contact areas of the semiconductor stack chips.

In its thinnest embodiment, the rewiring plane has three layers, namely a first insulation layer adhering to the active upper side of the semiconductor stack chip, a rewiring layer of flat conductors arranged thereon, and a second insulation layer adhering to the rear side of the next semiconductor chip. In this case, the flat conductors of the rewiring layer form both the electrical connection between the first contact regions and the contact areas of the semiconductor chips in the bonding hole, as well as the electrical stack connections between the second contact regions of the rewiring plane and the contact-terminal areas of the rewiring substrate. For this thinnest embodiment of the rewiring plane, the external dimensions, or the surface area, of the rewiring plane corresponds to the surface area of the active upper side of the semiconductor stack chip, and only the flat conductors for connection to the contact-terminal areas of the rewiring substrate extend beyond the rewiring plane. Since such a rewiring plane corresponds to the dimensions of the semiconductor stack chip, which imparts stability and strength to the assembly, both the first insulation layer and the second insulation layer can be formed as non-self-supporting insulation films which are only a few micrometers thick.

In a further embodiment of the rewiring plane, it has a self-supporting core layer, which is covered by an upper rewiring layer and a lower rewiring layer. This self-supporting rewiring plane extends beyond the dimensions of the semiconductor stack chip so that second contact regions, which are connected to the contact-terminal areas of the rewiring substrate by bonding-wire connections, can be arranged in the edge regions which are not covered by the semiconductor stack chip. In this embodiment as well, the rewiring plane firstly has an insulation layer adhering to the active upper side of the semiconductor stack chip. This is followed by an upper rewiring layer, which extends beyond the edges of the semiconductor stack chip and is connected to a lower rewiring layer by vias of a subsequent insulating core layer. This lower rewiring layer has bonding fingers as first contact regions in the vicinity of the bonding hole, which are connected to the contact areas of the semiconductor stack chip.

With this further embodiment, standardized bonding techniques can be used in order to connect the semiconductor stack chip to its rewiring planes and in order to connect the rewiring planes to the rewiring substrate by stack bonding connections, which reduces the costs for the electronic device. The thickness of the rewiring planes is in this case determined by a total of five layer sequences, so as to produce a self-supporting rewiring plane which is so geometrically stable in its edge region, and in the vicinity of the bonding hole, that it can be processed with bonding techniques.

The bonding holes in the rewiring planes may be covered with a covering of a plastic composition, independently of any molding of the package. This situation gives rise to interfaces of the covering of the bonding holes of the rewiring planes and of the plastic packaging composition. A spacer from the rewiring plane of the stack chip may furthermore be provided on the first semiconductor chip, in order to ensure that plastic composition can be introduced between the first semiconductor chip and the stack chip with the rewiring plane.

Provision may furthermore be made for a layer of plastic package composition to be applied to the rewiring plane in order to fill the bonding hole and in order to planarize the rewiring plane, so as to permit planar adhesion of the layer of plastic package composition on the rear side of the first semiconductor chip. In this case, the stack may be exposed to a lower injection-molding pressure when the package is being molded, since no narrow cavities need to be filled between the first semiconductor chip and a semiconductor stack chip. This avoids stressing of the stack connections which are at risk during the molding.

In order to intensify the thermal dissipation of the semiconductor stack chip by the rewiring substrate, additional vias which do not fulfill any electrical connection function may be provided in the rewiring plane. Rather, the heat balances of the semiconductor chips are homogenized between one another and an improved thermal dissipation by the common rewiring substrate is obtained, and temperature-dependent electrical parameters of the two semiconductor chips are matched to one another.

Another possible way of improving the electronic device is achieved in that the respective rewiring plane has a rewiring layer, which provides for earthed metal areas between rewiring lines and/or flat conductors. These metal areas of the surfaces not required for rewiring lines or flat conductors can improve the screening of the semiconductor chip, so as to reduce any impairment of the function of the electronic device having a stack of semiconductor chips due to leakage fields.

A method for producing an electronic device having a stack of semiconductor chips comprises the following method steps. Firstly, both a rewiring substrate and a rewiring plane are produced. For the production of the rewiring substrate, an insulating core in the form of an insulating plate is provided with a bonding hole and with access holes. A lower first rewiring layer, which has external-contact areas and bonding fingers, is applied to the insulating core and is structured, the external-contact areas being arranged distributed over the lower side of the rewiring substrate and the bonding fingers being provided in the vicinity of the bonding hole. Rewiring lines are produced between external-contact areas and bonding fingers when the rewiring layer is being structured. An upper rewiring layer, which comprises contact-terminal areas and rewiring lines, is additionally applied to the core of insulating material, a connection between the rewiring lines on the lower side of the core and rewiring lines on the upper side of the core being achieved by vias in the access holes.

After the rewiring substrate has been completed, a first semiconductor chip with an active upper side and contact areas is applied to the upper side of the rewiring substrate, while aligning the contact areas with the bonding hole while leaving the contact-terminal areas of the rewiring substrate exposed. Bonding connections are subsequently produced between the contact areas and the bonding fingers in the edge region of the bonding hole. The bonding hole is then covered in a plastic composition while packaging the bonding connections and the edge region of the bonding hole.

These method steps create an assembly comprising a first semiconductor chip and the rewiring substrate, which is suitable for function testing and can be tested separately from the semiconductor stack chip. Non-functioning semiconductor chips with their rewiring substrates can hence be rejected early on.

At the same time as the above production steps, a rewiring plane can be produced with a bonding hole and first contact regions in the vicinity of the bonding holes and second contact regions, which are connected to one another. The active upper side of a semiconductor stack chip can be applied to this rewiring plane, the contact areas of the semiconductor stack chip being aligned with the bonding hole of the rewiring plane. Before further assembling of the electronic device, it is then possible to test successful assembling between the semiconductor chip and the rewiring plane, so that only functional semiconductor chips with their rewiring planes, or their rewiring substrate, are put together to form an electronic device. When assembling, the rewiring plane with the semiconductor stack chip is adhesively bonded to the first semiconductor chip. The stack connections from the second contact regions of the rewiring plane to the contact-terminal areas of the rewiring substrate are then produced. The structure of the stack is then complete, apart from the application of a package.

This method produces electronic devices having a stack of semiconductor chips by using simple means but with the utmost reliability, while keeping the rejection rate of nonfunctioning electronic devices low. External contacts can be applied to the external-contact areas of the rewiring substrate. Such external contacts may merely consist of a solder reservoir, or comprise solder balls or solder bumps, or be formed as contact columns.

The rewiring plane may have a metal layer coated with insulation films, the metal layer being structured so that metal areas, which are joined to an earth potential, are kept between rewiring lines. With this method, on the one hand, the screening of leakage fields is improved and, on the other hand, the thermal dissipation of the semiconductor stack chip can be matched to the thermal dissipation of the first semiconductor chip, of the electronic device.

With the present invention, it is possible to construct a stacked FBGA device (fine pitch ball grid array device) in which both semiconductor chips are aligned ideally with respect to a DRAM standard bailout. This arrangement ensures good electrical properties in respect of low stray capacitances and inductances. The invention furthermore combines available techniques and materials. Lastly, the structure of the electronic device according to the invention avoids techniques which are not tried-and-tested and makes it possible to transfer intermediate products, such as rewiring planes and rewiring substrates, to subcontractors for the packaging technique.

The lower first semiconductor chip may be mounted according to a BOC technology (board-on-chip technology). The semiconductor stack chip is likewise mounted, similarly as a BOC device, on a further substrate strip in the form of a rewiring plane. This rewiring plane is as thin as possible and has only a reduced mechanical function, since it does not itself have to carry the stack. The small thickness of the rewiring plane leads to a small height, which reduces the overall installation height of the electronic device and provides for better thermal properties of the package.

The rewiring plane may have two rewiring layers, which in the overall structure has a lower rewiring layer and an upper rewiring layer. In this case, the lower rewiring layer is used for the BOC contact-making of the semiconductor stack chip, and the upper rewiring layer is used for the wire bonding from the rewiring plane to the rewiring substrate of the first semiconductor chip. The rewiring plane may be produced from a printed-circuit-board laminate or from a polyimide film. The contact between the rewiring layers is achieved by vias which are as thin as possible, as is customary in the case of a two-plane substrate technique.

A maximal multiplicity of vias, which may also include DUMMY vias, provides for intensive thermal contact between the upper semiconductor stack chip and the lower first semiconductor chip. The lower rewiring layer of the rewiring plane leads the lines from the contact areas to the wire-bonding terminals in the edge region of the rewiring plane. The upper side may be metallized surface-wide and at earth potential for screening, and hence used to reduce inductances. The contact-making between the chips can be carried out in a variety of ways:

1. Mounting of the upper assembly, comprising the semiconductor stack chip and the rewiring plane, directly on the lower first semiconductor chip with the use of spacing films, the cavity between the semiconductor chips being filled during the subsequent transfer molding;

2. More comprehensive preparation of the assembly, comprising the semiconductor stack chip and the rewiring plane, by covering the bonding-channel hole in the rewiring plane, so that the bonding wires are additionally protected;

3. Extensive coverage of the upper assembly and, after having covered the upper assembly, application onto the lower first semiconductor chip by using an additional adhesive layer; and 4. Extensive coverage of the upper assembly and application of the upper assembly onto the lower first semiconductor chip by using a self-adhesive plastic packaging composition.

After wire bonding between the rewiring plane and the rewiring substrate, the package can be produced by molding, printing or dispensing, and the bonding hole for a bonding channel in the rewiring substrate may be encapsulated at the same time. In principle, the gap between the semiconductor stack chips may also be filled during the molding, printing or dispensing. Compensation for the stray capacitances and inductances between the lower chip and the upper chip is carried out by appropriate structuring in the respective rewiring layers of the rewiring plane and of the rewiring substrate. To this end, the lower signal lengths may be increased so that they correspond as far as possible to the upper signal lengths.

The construction of the individual components for the electronic device having stacked semiconductor chips may be carried out using standard materials. The thicknesses of the individual components, such as the rewiring plane and the rewiring substrate, are in this case optimized in such a way as to achieve an overall height of the components which is as small as possible.

In one embodiment of the invention a face-down-face-down arrangement of the semiconductor chip leads to the shortest possible signal-line lengths, and therefore to minimal parasitic effects.

In another embodiment of the invention the electronic device can be used for high-performance memories (DDRII memories).

In another embodiment of the invention the propagation-time differences between the stacked upper semiconductor chip and the first lower semiconductor chip are balanced out by design measures for the rewiring plane and the rewiring substrate, respectively.

In another embodiment of the invention it is possible to use conventional technologies in order to minimize costs and minimize rejects.

In another embodiment of the invention high-risk rewiring structures are obviated.

In another embodiment of the invention the electronic device is compatible with bailout standards.

In another embodiment of the invention the method according to the invention permits function testing of individual semiconductor chips even before stacking.

In another embodiment of the invention the small overall height of the stacked FBGA device according to the invention fulfills the standards for packaging and module techniques.

In another embodiment of the invention the structure is suitable both for a single-row contact-area arrangement in bonding channels and for two-row arrangements of contact areas in bonding channels.

In another embodiment of the invention existing systems can be used for assembling and for the function test.

According to a further aspect of the invention, flat-conductor bonding is provided for the semiconductor stack chip and the rewiring plane, wherein the contact areas of the semiconductor stack chip are bonded to flat-conductor ends, which span a bonding channel, by tearing the flat-conductor ends at a target position. The other ends of the flat-conductor tracks, which extend beyond edges of the semiconductor stack chip, are subsequently soldered, or connected by means of friction welding, onto the contact-terminal areas of the rewiring substrate.

By using thin films between which the flat conductors are embedded, and by using flat-conductor bonding, the thermal problems between the first semiconductor chip and the semiconductor stack chip are reduced because a comparatively flat structure is obtained. Better electrical properties can be achieved owing to the reduced thermal problems. The opportunity is furthermore available to integrate additional structures into the flat-conductor track plane, in order to screen the conductor tracks from one another. Lastly, this technique has the further advantage that "scattering" of bonding wires is prevented when molding, since the flat conductor tracks lie insulated between films. A thin flexible layer is hence obtained between the semiconductor chips.

BRIEF DESCRIPTION OF THE DRAWINGS

The invention will now be explained in more detail with reference to the appended figures.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
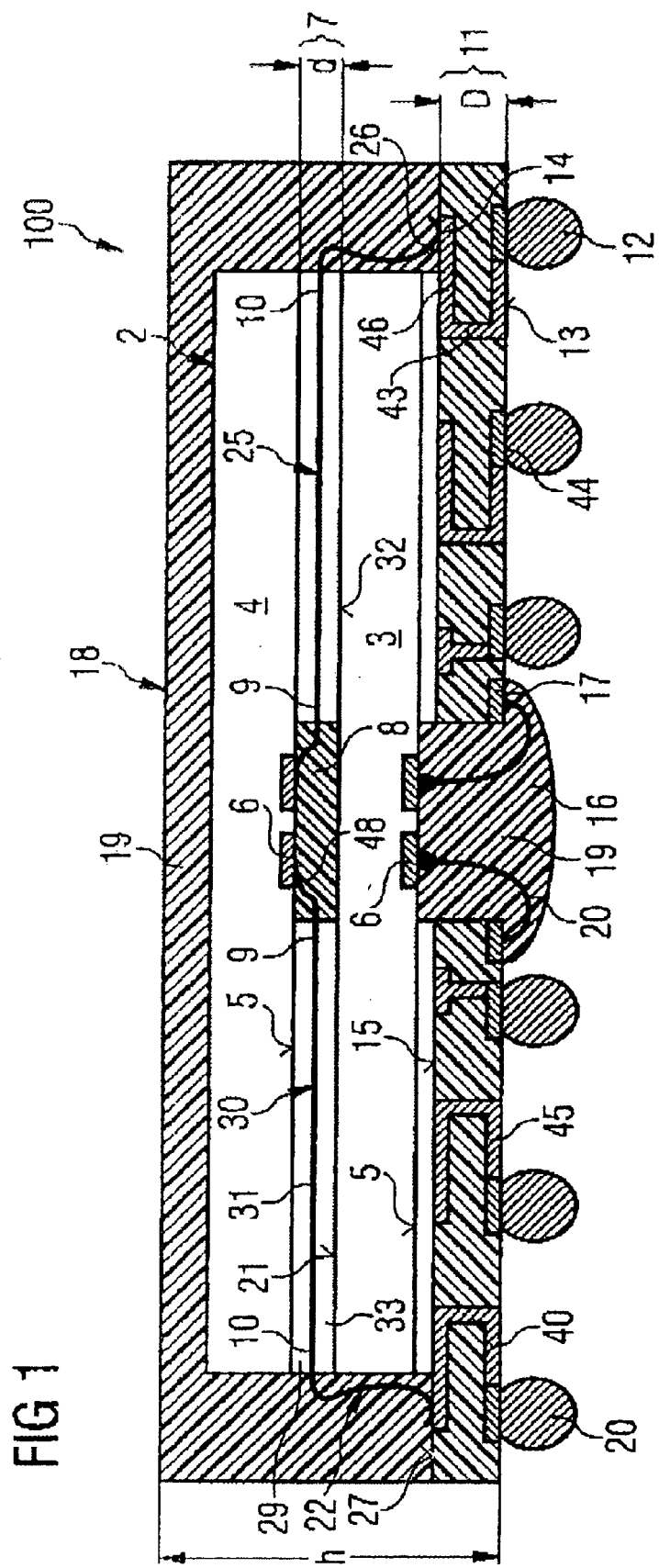
FIG. 1 illustrates a schematic cross section through an electronic device, having a stack of semiconductor chips, according to a first embodiment of the invention.

FIG. 1 illustrates a schematic cross section through an electronic device 100, having a stack 2 of semiconductor chips 3 and 4, according to a first embodiment of the invention. The semiconductor chips 3 and 4 have active upper sides 5 with contact areas 6. A rewiring plane 7, which has a continuous bonding hole 8 at its center, is arranged between the semiconductor chips 3 and 4. In this first embodiment of the invention, the rewiring plane has a first insulation layer 29 and a second insulation layer 33, between which a rewiring layer 30 of flat conductors 31 is arranged. First contact regions 9 of the flat conductors 31, which are connected to second contact regions 10 in outer edge regions of the rewiring plane 7, are arranged in the vicinity of the bonding hole 8. A stacked semiconductor stack chip 4 is arranged with its active upper side 5 on the rewiring plane 7.

A first semiconductor chip 3, which is mounted on a rewiring substrate 11, is arranged below the rewiring plane 7. The rewiring substrate 11 differs from the rewiring plane 7 by its greater stability and its larger thickness D compared with the thickness d of the rewiring plane 7.

On its lower side 13, the rewiring substrate 11 has external contacts 12, which are at the same time external contacts 12 of the electronic device 100. On its upper side 15, contact-terminal areas 14 are arranged in exposed edge regions 27. A bonding hole 16, in the vicinity of which bonding fingers 17 are arranged on the lower side 13 of the rewiring substrate 11, is arranged at the center of the rewiring substrate 11.

The contact areas 6 are arranged as two rows in a central bonding channel of the active upper side 5 of the first semiconductor chip 3. These contact areas 6 are connected by bonding connections 20 to the bonding fingers 17 on the lower side 13 of the rewiring substrate 11. The bonding fingers 17 are connected by rewiring lines 45 to external-contact areas 44 on the lower side 13 of the rewiring substrate 11, the external-contact areas 44 carrying the external contacts 12.

The rewiring lines 45 of a lower rewiring layer 40 of the rewiring substrate 11 are connected by vias 43 to the rewiring lines 46 on the upper side 15 of the rewiring substrate 11. These rewiring lines 46 connect the contact-terminal areas 14 in the edge regions 27 to the vias 43. The external contacts 12 are hence electrically connected to the contact areas 6 of the first semiconductor chip 3 and, at the same time, to the contact-terminal areas 14 by rewiring lines 45, 46 and vias 43.

Outer flat-conductor ends 26, which extend beyond the rewiring plane 7 and are bent towards the rewiring substrate 11 to form stack connections 22, are soldered onto the contact-terminal areas 14. These flat-conductor ends 26 merge with the flat conductors 31 of the rewiring layer 30, which are in turn connected to the first contact regions 9. These first contact regions 9 merge with exposed inner flat-conductor ends 48, which are arranged in the bonding hole 8 of the rewiring plane 7. These inner flat-conductor ends 48 are connected to contact areas 6 in a central bonding channel of the semiconductor stack chip 4. The external contacts 12 of the electronic device 100 are hence connected, at the same time, to the contact areas 6 of the semiconductor stack chip 4 and to the contact areas 6 of the rewiring substrate.

Owing to the small thickness d of the rewiring plane 7, good heat exchange takes place between the semiconductor stack chip 4 and the first semiconductor chip 3 through the lower side 21 of the rewiring plane 7, so that the two semiconductor chips 3 and 4 are at approximately the same temperature during operation, and their temperature-dependent electrical parameters are hence kept approximately equal. The length of the connection between the external contacts 12 and the contact areas 6 of the semiconductor stack chip 4, compared with the lengths of the connection between the external contacts 12 and the contact areas 6 of the first semiconductor chip, is not represented as being equally long in FIG. 1 in order to simplify the representation, although they are designed with a uniform length by appropriate matching of the lengths of the rewiring lines 45 between bonding fingers 17 and external contacts 12, so as to avoid propagation-time differences between the two semiconductor chips 3 and 4. In one exemplary embodiment (not shown here), they are of different length.

The exposed edge regions 27, which are not covered by the stack 2 of semiconductor chips 3 and 4, are protected against damage by a plastic composition 19 which forms the package 18. At the same time, the flat-conductor ends 26 and the semiconductor chips 3 and 4 are fully embedded in this plastic packaging composition 19. The semiconductor chips 3 and 4 which are stacked here are memory modules, of the same type, stacked on one another together in an FBGA package, specifically to form a memory module with multiple storage capacity, in this case doubled.

Figure 2:
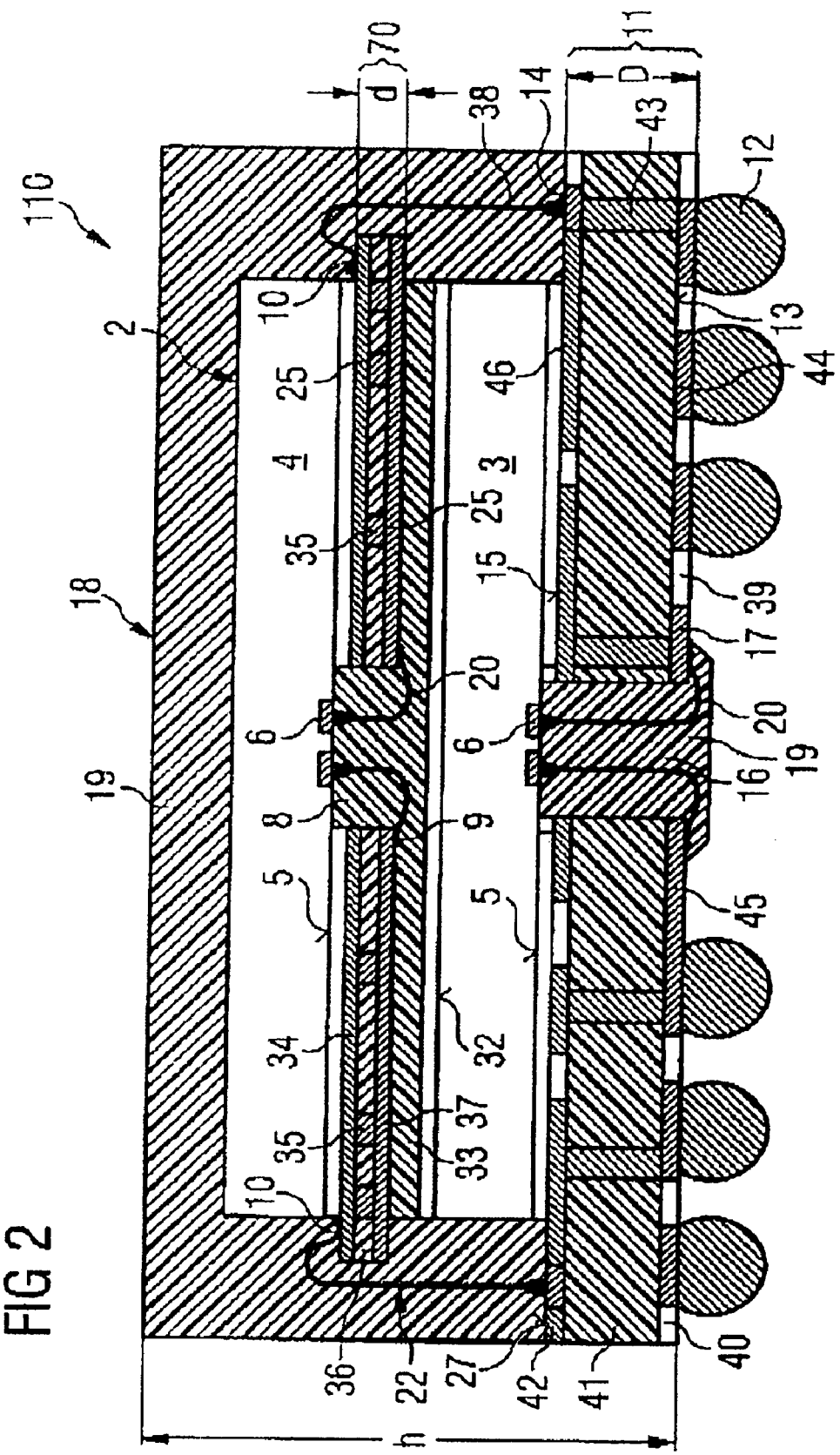
FIG. 2 illustrates a schematic cross section through an electronic device, having a stack of semiconductor chips, according to a second embodiment of the invention.

FIG. 2 shows a schematic cross section through a further electronic device 110, having a stack 2 of semiconductor chips 3 and 4, according to a second embodiment of the invention. Components having the same functions as in FIG. 1 are denoted by the same reference numerals, and will not be explained separately.

The rewiring substrate 11, which carries the stack 2 of semiconductor chips 3 and 4, is constructed similarly as in the first embodiment according to FIG. 1. From the bottom upwards, the structure of the rewiring substrate 11 firstly has external contacts 12 which are arranged on a lower rewiring layer 40, which in turn has external-contact areas 44 onto which the external contacts 12 are soldered. From the external-contact areas 44, rewiring lines 45 in the lower rewiring layer 40 lead to bonding fingers 17, which are arranged in the vicinity of the bonding hole 19 of the rewiring substrate 11.

An insulating core layer 41, which imparts geometrical stability and strength to the rewiring substrate 11, is arranged over the lower rewiring layer 40. Vias 43, which connect the lower rewiring layer 40 to an upper rewiring layer 42, extend through this insulating core layer 41. In exposed edge regions 27, this upper rewiring layer 42 has contact-terminal areas 14 which are connected to a rewiring plane 70 by stack bonding connections 22 comprising a bonding wire 38.

The rewiring plane 70 according to FIG. 2 differs from the rewiring plane 7 of the first embodiment according to FIG. 1 in that it has a lower rewiring layer 37 and an upper rewiring layer 34, with an insulating core layer 36 arranged in between. Vias 35, which connect the rewiring lines 25 of the lower rewiring layer 37 to rewiring lines 25 of the upper rewiring layer 34, are arranged in the insulating core layer 36.

The rewiring plane 70 is designed to be more stable than the rewiring plane 7 of the first embodiment according to FIG. 1, and extends beyond the active upper side 5 of the semiconductor stack chip 4 so as to create exposed edge regions, which have second contact regions 10 that are connected to the contact-terminal areas 14 of the rewiring substrate 11 by the bonding wires 38. In this embodiment, the external contacts 12 are hence connected to the contact areas of the semiconductor stack chip by vias 43 of the rewiring substrate 11 and bonding wires 38, as well as vias 35 of the rewiring plane 70 and bonding connections 20 in the channel hole 8 of the rewiring plane 70. Signal propagation times affected by stray capacitances and inductances, as well as by the connection length between an outer contact 12 and contact areas 6 of the semiconductor chips 3 and 4, are matched to one another between the semiconductor stack chip 4 and the first semiconductor chip 3 by appropriate rewiring-line dimensioning in the rewiring layers 40 and 42 of the rewiring substrate 11. In one exemplary embodiment (not shown here), they are of different length.

In the second embodiment according to FIG. 2, the rewiring plane 70 is covered by a plastic composition which is arranged uniformly over the full width of the semiconductor stack chip 4 and, at the same time, fills the bonding-channel hole 8 with the bonding connections 20 of the rewiring plane 70. There is therefore no interface between the plastic composition in the bonding hole 8 and the plastic composition which covers the rewiring plane 70. The electronic device 110 of the second embodiment of the invention also uses memory chips with a central bonding channel having two rows of contact areas with the FBGA technique. In one exemplary embodiment (not shown here), memory chips having one row of contact areas are used.

Figure 3:
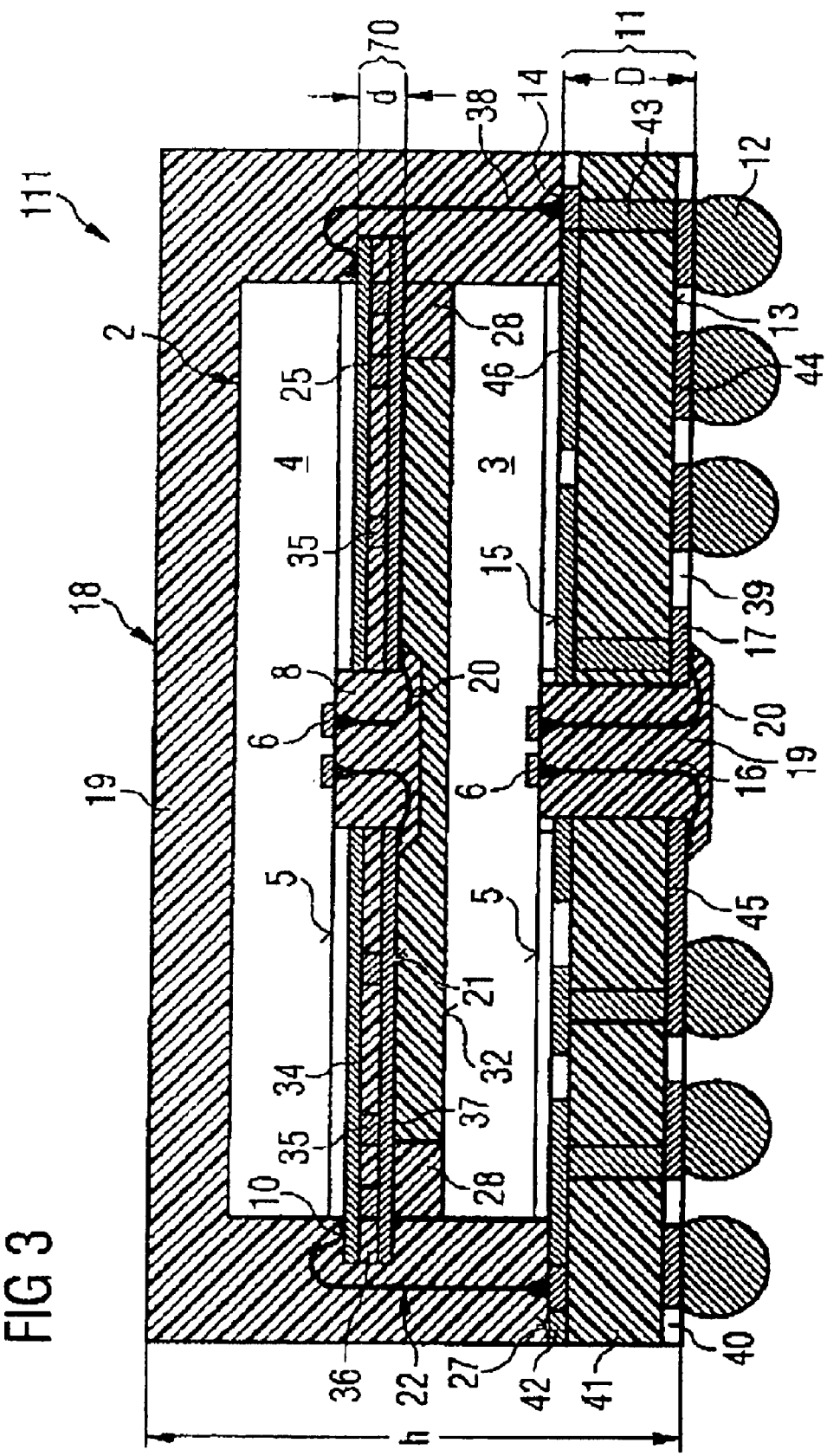
FIG. 3 illustrates a schematic cross section through an electronic device, having a stack of semiconductor chips, according to a third embodiment of the invention.

FIG. 3 illustrates a schematic cross section through a further electronic device 111, having a stack 2 of semiconductor chips 3 and 4, according to a third embodiment of the invention. Components having the same functions as in the previous figures are denoted by the same reference numerals, and will not be explained separately.

One difference between the electronic device 111 according to FIG. 3 and the device 110 according to FIG. 2 is that a spacer 28 is arranged between the rewiring plane 70 and the rear side 32 of the first semiconductor chip 3, so that any gap between the rewiring plane 70 and the rear side 32 of the first semiconductor chip 3 is simultaneously filled with the plastic packaging composition 19, when this plastic composition 19 is being applied. In order to avoid endangering the sensitive bonding wires 20 in the bonding channel 8 of the semiconductor stack chip 4 when the plastic composition 19 is being introduced, however, the bonding hole 8 has been already filled with a plastic composition, so that a boundary layer 49 is formed between the plastic compositions.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic device having a stack of semiconductor chips, the electronic device comprising:

a first semiconductor chip and at least one semiconductor stack chip stacked onto the first semiconductor chip, the semiconductor chips each having an active upper side with contact areas;

a rewiring plane arranged between the semiconductor chips and having a continuous first bonding hole;

first contact regions in the vicinity of the first bonding hole;

second contact regions which are connected to first contact regions of the rewiring plane;

a rewiring substrate having external contacts of the electronic device on a lower side of the rewiring substrate and having a second continuous bonding hole;

contact-terminal areas on an upper side of the rewiring substrate;

bonding fingers on the lower side of the rewiring substrate, in the vicinity of the second bonding hole;

a package which has a plastic packaging composition; and contact areas of the first semiconductor chip being connected by bonding connections through the second bonding hole of the rewiring substrate to bonding fingers of the rewiring substrate, and first contact regions on a lower side of the rewiring plane being connected through the first bonding hole of the rewiring plane to contact areas of the semiconductor stack chip and second contact regions of the rewiring plane being connected to contact-terminal areas of the rewiring substrate by stack connections.

2. The electronic device according to claim 1, wherein the first contact regions and the second contact regions are connected to one another by a rewiring structure in the rewiring plane.

3. The electronic device according to claim 1, wherein the first contact regions of the rewiring plane are arranged in the vicinity of the lower side of the rewiring plane, and in that the second contact regions are arranged in the vicinity of the upper side of the rewiring plane.

4. The electronic device according to claim 1, wherein the rewiring plane has a conductor-track layer with rewiring lines, which are insulated on both sides, the first contact regions and the second contact regions being formed as flat-conductor ends of rewiring lines.

5. The electronic device according to claim 1, wherein the upper side of the rewiring substrate is larger than the active upper side of the first semiconductor chip, and the contact-terminal areas are arranged on exposed edge regions of the rewiring substrate, which are not covered by the first semiconductor chip.

6. The electronic device according to claim 1, wherein the plastic packaging composition is arranged on the upper side of the rewiring substrate, wherein the semiconductor chips are packaged in the plastic composition wherein the plastic composition is arranged on the lower side of the rewiring substrate and on the lower side of the rewiring plane, and wherein bonding connections are embedded in the first and second bonding holes.

7. The electronic device according to claim 1, wherein spacers from the rewiring plane are arranged on the first semiconductor chip.

8. The electronic device according to claim 1, wherein the rewiring plane has a first insulation layer adhering to the active upper side of the semiconductor stack chip, a rewiring layer of flat conductors, and a second insulation layer adhering to a rear side of the first semiconductor chip, the flat conductors of the rewiring layer forming both electrical connections between first contact regions and contact areas in the first bonding hole as well as the electrical stack connections between the second contact areas and the contact-terminal areas of the rewiring substrate.

9. The electronic device according to claim 1, wherein the rewiring plane has an insulation layer adhering to the active upper side of the semiconductor stack chip, and an upper rewiring layer extending beyond edges of the semiconductor stack chip, and an insulating core layer having vias, a lower rewiring layer and a plastic layer of plastic package composition, covering the first bonding hole and the lower rewiring layer, contact-terminal areas being arranged on edge regions of the upper rewiring layer and forming the stack connections to the contact-terminal areas of the rewiring substrate by bonding wires.

10. The electronic device according to claim 1, wherein the rewiring plane has a rewiring layer, which has earthed metal areas between rewiring lines or flat conductors.

11. The electronic device according to claim 1, wherein the rewiring plane has insulation layers of insulation films.

12. The electronic device according to claim 1, wherein the rewiring substrate has a solder resist layer, a lower rewiring layer, an insulating core layer, and an upper rewiring layer, the core layer having vias which electrically connect the lower rewiring layer to the upper rewiring layer, and the lower rewiring layer having external-contact areas which carry the external contacts of the electronic device, and rewiring lines which connect the external-contact areas to the bonding fingers in the vicinity of the second bonding hole, and the upper rewiring layer having rewiring lines which connect the vias to the contact-terminal areas.

13. A method for producing an electronic device having a stack of semiconductor chips, the method comprising the steps:

producing a rewiring substrate with external-contact areas and with bonding fingers on a lower side, the bonding fingers being arranged in an edge region of a substrate continuous bonding hole, and with an upper side which has the contact-terminal areas in its outer edge region;

adhesively bonding a first semiconductor chip with an active upper side and contact areas onto the upper side of the rewiring substrate, while aligning the contact areas with the substrate bonding hole and while leaving the contact-terminal areas of the rewiring substrate exposed;

producing bonding connections between the contact areas and the bonding fingers;

packaging the substrate bonding hole, the bonding connections and the edge region of the substrate bonding hole in a plastic composition;

producing a rewiring plane with a plane bonding hole, first contact regions in the vicinity of the plane bonding hole and with second contact regions, which are connected to the first contact regions;

applying a semiconductor stack chip with an active upper side onto the rewiring plane, while aligning the contact areas with the plane bonding hole;

adhesively bonding the rewiring plane with the semiconductor stack chip onto the first semiconductor chip;

producing connections from the second contact regions to the contact-terminal areas of the rewiring substrate; and applying a plastic packaging composition onto the upper side of the rewiring substrate, while embedding the semiconductor chips and exposed connections.

14. Method according to claim 13, wherein an assembly comprising the first semiconductor chip and the rewiring substrate and an assembly comprising the semiconductor stack chip and the rewiring plane are tested in separate function tests, and wherein the function test of the electronic device is carried out after completion of the electronic device.

15. Method according to claim 13, wherein external contacts are applied to the external-contact areas after the plastic packaging composition has been applied.

16. Method according to claim 13, wherein, for the rewiring plane, insulation films are coated with a metal layer and the metal layer is structured so that metal areas, which are joined to an earth potential, are kept between rewiring lines.

17. Method according to claim 16, wherein, as second contact regions for the rewiring plane, outer flat-conductor ends are formed, which extend beyond edges of the rewiring plane and are soldered onto contact-terminal areas of the rewiring substrate as stack connections.

18. An electronic device having external contacts, the electronic device comprising:

a first semiconductor chip having an active upper side and having contact areas;

at least one semiconductor stack chip stacked onto the first semiconductor chip, the semiconductor stack chip having an active upper side and having contact areas;

a rewiring plane arranged between the first semiconductor chip the semiconductor stack chip, the rewiring plane having a lower side, an upper side, a plane bonding hole and first and second contact regions, wherein the first and second contact regions are connected to each other and wherein the first contact region is in the vicinity of the plane bonding hole;

a rewiring substrate having a lower side, an upper side and a substrate bonding hole, wherein the external contacts of the electronic device are on the lower side of the rewiring substrate, contact-terminal areas are on the upper side of the rewiring substrate and wherein bonding fingers are on the lower side of the rewiring substrate in the vicinity of the substrate bonding hole;

bonding connections connecting the contact areas of the first semiconductor chip to the bonding fingers through the substrate bonding hole, wherein the first contact regions are connected through the plane bonding hole to the contact areas of the semiconductor stack chip; and stack connections connecting the second contact regions to the contact-terminal areas.

* * * * *

UNITED STATES PATENT AND TRADEMARK OFFICE
CERTIFICATE OF CORRECTION

| | |
|---|---|
| PATENT NO. | : 6,894,381 B2 |
| APPLICATION NO. | : 10/738071 |
| DATED | : May 17, 2005 |
| INVENTOR(S) | : Wolfgang Hetzel et al. |

It is certified that error appears in the above-identified patent and that said Letters Patent is hereby corrected as shown below:

Column 5, Line 35, delete "bailout" and insert in place thereof --ballout--.

Column 6, Line 64, delete "bailout" and insert in place thereof --ballout--.

Signed and Sealed this

Twenty-sixth Day of December, 2006

JON W. DUDAS
*Director of the United States Patent and Trademark Office*